United States Patent

[11] 3,628,483

[72] Inventor William Vito Pauza
Palmyra, Pa.

[21] Appl. No. 21,328
[22] Filed Mar. 20, 1970
[45] Patented Dec. 21, 1971
[73] Assignee AMP Incorporated
Harrisburg, Pa.

[54] METHOD OF MAKING POWER FRAME FOR INTEGRATED CIRCUIT
4 Claims, 7 Drawing Figs.

[52] U.S. Cl. .......... 113/119, 29/630 A, 29/576 S, 174/DIG. 3, 317/234 N, 29/193.5
[51] Int. Cl. .......... H01r 9/00
[50] Field of Search .......... 113/119; 29/630 B, 589, 576 S, 193.5; 174/DIG. 3, 52 PE; 317/234 A, 234 N

[56] References Cited

UNITED STATES PATENTS

| | | | |
|---|---|---|---|
| 3,234,320 | 2/1966 | Wong .......... | 174/DIG. 3 |
| 3,281,628 | 10/1966 | Bauer et al .......... | 113/119 |
| 3,524,249 | 8/1970 | Ha Mada et al .......... | 29/588 |

*Primary Examiner*—Richard J. Herbst
*Attorneys*—Curtis, Morris and Safford, William J. Keating, William Hintze, Adrian J. La Rue, Frederick W. Raring, Jay L. Seitchik and John P. Vandenburg

ABSTRACT: This disclosure relates to power frames for mounting integrated circuits and, more particularly, to a metallic mounting member upon which a semiconductor device may be mounted and connected to form a completed device utilizing automatic equipment for assembly encapsulation, the mounting member including provision for efficient and rapid dissipation of heat produced in the semiconductor device.

METHOD OF MAKING POWER FRAME FOR INTEGRATED CIRCUIT

This invention relates to lead frames for semiconductor devices and method of making same, and more particularly, to a metallic mounting frame for semiconductor devices and particularly integrated circuits, capable of rapidly dissipating heat generated within the semiconductor element.

Lead frames for use with integrated circuits and semiconductors, in general, are well known in the art and devices of this type are exemplified by the U.S. Pat. Nos. to Lehner (3,431,092) and Kauffman (3,436,810). While lead frames of the type described in these patents have been readily accepted by the industry, and while these devices perform useful results, there is still a problem of heat dissipation from the semiconductor device which has been inadequately solved by the prior art lead frames.

In accordance with the present invention, there is provided a lead frame for use with semiconductors and particularly with integrated circuits wherein a lead frame is stamped out and formed in a manner to provide a heavy heat conductive mounting for the semiconductor, disposed below the terminal members of the frame, for supporting the semiconductor element thereon and for providing a substantial heat sink element when compared with prior art lead frames. Briefly, in accordance with the present invention, lead frame material is provided from a sheet of conductive material such as copper, Alloy 42, or the like, which has a thickened central section formed by a milling operation or by roll bonding the heat sink material onto the lead frame conductor material. The material is then stamped out in conventional manner and the lead frame units then go through several forming operations to provide the finalized unit or lead frame wherein the heat sink material is positioned directly below the conductor terminals of the frame.

It is therefore an object of this invention to provide a power lead frame having high heat sink properties relative to the prior art lead frames.

It is a further object of this invention to provide a method of producing a power lead frame from a single piece of material having different thicknesses.

It is still a further object of this invention to provide a one-piece power lead frame having superior heat sink properties relative to prior art devices.

The above objects and still further objects of the invention will become apparent to those skilled in the art after consideration of the following preferred embodiments thereof, which are provided by way of example and not by way of limitation wherein.

Figures 1, 2, 3, 4, 5:
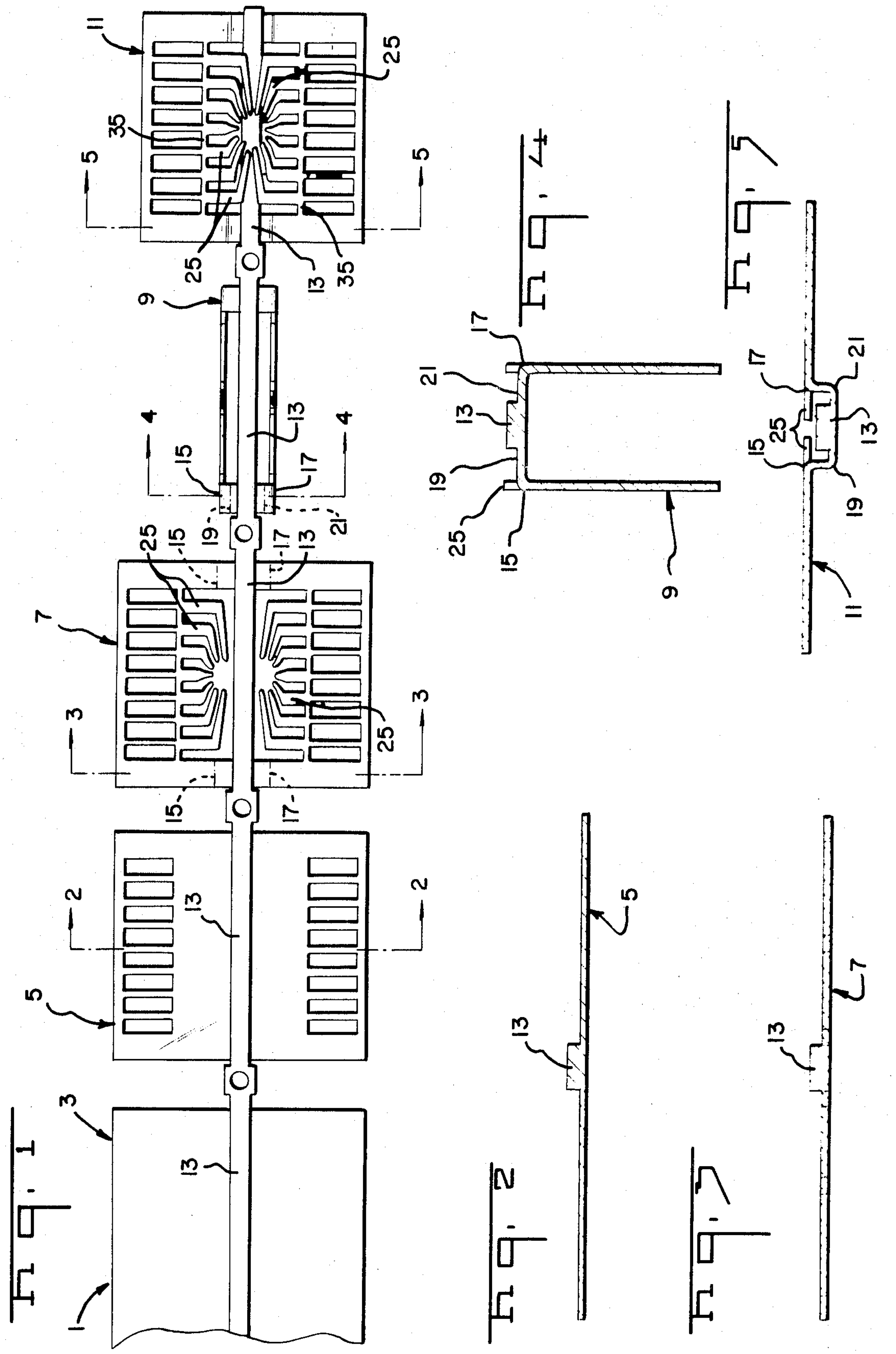
FIG. 1 is an elevational view of a strip of blanking material on which the operations required for providing a strip of completed lead frames in accordance with the present invention have been performed.
FIG. 2 is a cross-sectional view taken along the line 2—2 of FIG. 1.
FIG. 3 is a cross-sectional view taken along the line 3—3 of FIG. 1.
FIG. 4 is a cross-sectional view taken along the line 4—4 of FIG. 1.
FIG. 5 is a cross-sectional view taken along the line 5—5 of FIG. 1.

Referring first to FIG. 1, there is shown a blank of conductive material, such as copper or the like 1, which has been cut in normal manner to provide blanks 3, 5, 7, 9 and 11. Prior to cutting, a heat sink material 13 was roll bonded onto the lead frame material 1. It should be understood that, according to a second embodiment, rather than roll bonding heat sink material to the lead frame material 1, the lead frame material 1 could initially be provided with a thickened portion at its central region, the entire blank being made from electrically conductive and heat conductive material. The one-piece blanking material as shown in FIG. 1 is then passed through stamping machines in known manner wherein a portion of the blank 7 is ultimately cut out to a desired pattern as shown in FIG. 1. The one-piece blank will then move into a bending apparatus wherein the blank 7 will be bent along the lines 15 and 17 thereof by placing a 90° bend downwardly along each of the lines 15 and 17 to provide a stamped and once bent structure 9 as shown in FIGS. 1 and 4. The one-piece blank will then move to a further bending apparatus which will provide a 90° bend along the lines 19 and 21 to provide the structure as shown in element 11 of FIG. 1 and FIG. 5. The frame is then severed for final encapsulation.

The final form of the cut out blank prior to severing from the interconnecting heat sink portion 23 is shown by the blank 11 of FIG. 1 and in FIG. 5. The final blank includes terminal portions 25 for connection to a semiconductor device with the heat sink 13 positioned below the end portions of the terminal members 25.

Figure 6:
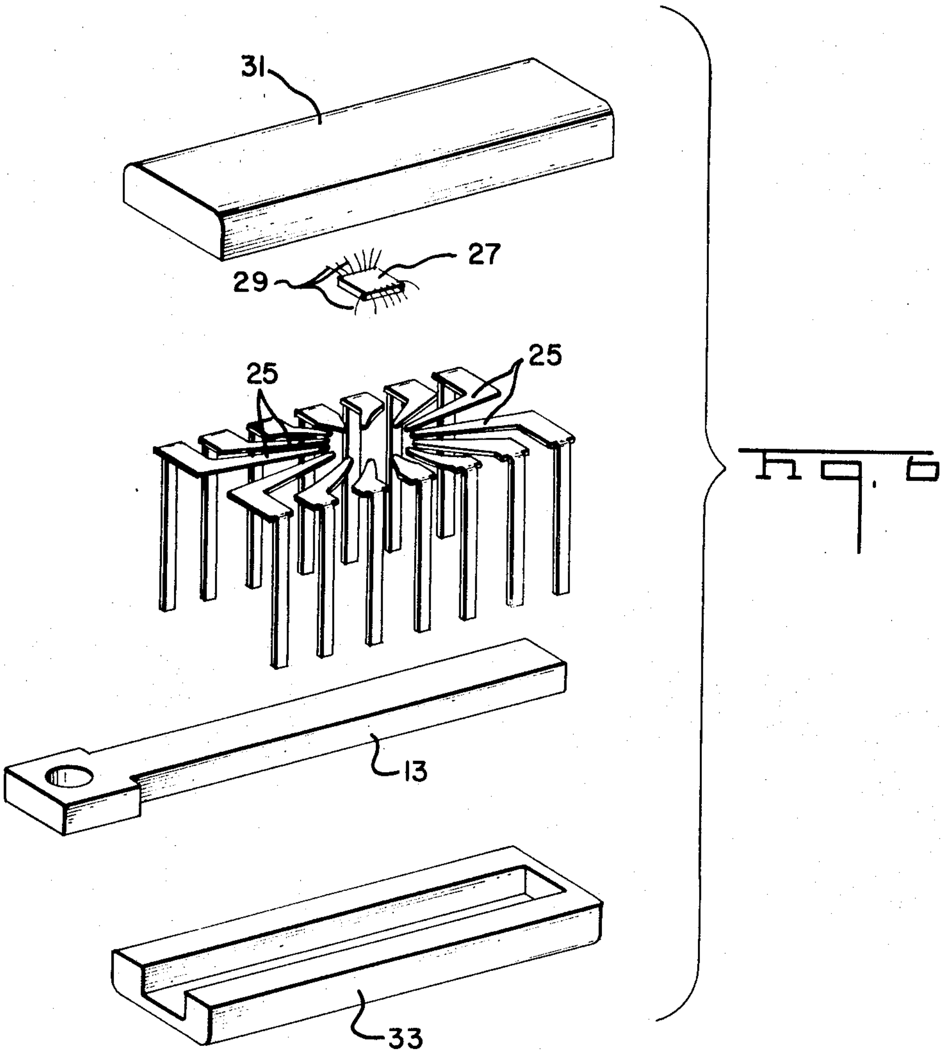
FIG. 6 is an exploded view of a semiconductive package utilizing the lead frame of the present invention.
Figure 7:
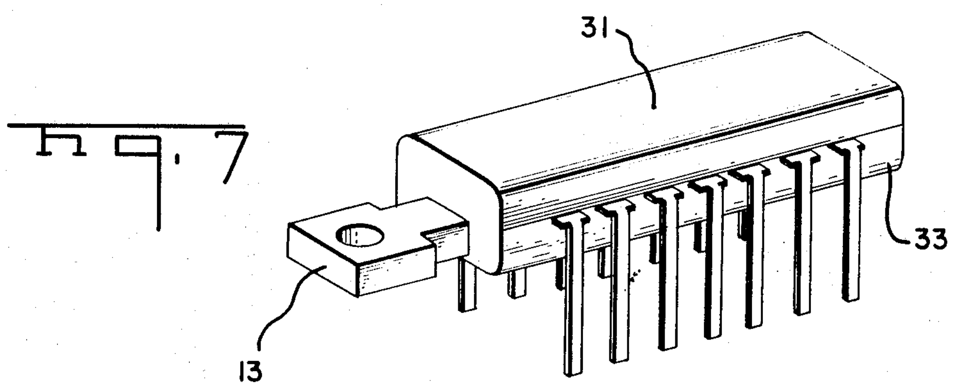
FIG. 7 is an elevational view of the assembled components shown in FIG. 6.

In actual operation, a strip of lead frames as shown in FIG. 1, but completed as shown in the element 11 thereof, will move along and a semiconductor device 27 as shown in FIG. 6 will be attached to the heat sink 13, between the ends of the terminals 25. Conductors 29 will then be connected from the semiconductor device 27 to predetermined ones of the leads 25. The frame structure with a semiconductor device secured thereto will then be encapsulated after bending of the lead members 25 as shown in FIG. 7. After encapsulation tie strip portions 35 and the outer edges of the frame are removed, also as shown in FIGS. 6 and 7. The result, is an encapsulated semiconductor device positioned on a lead frame having substantial heat sink properties relative to the prior art, the heat sink extending outwardly to the exterior of the encapsulated device for elimination of heat therefrom.

Though the invention has been described with respect to specific preferred embodiment thereof, many variations and modifications thereof will immediately become apparent to those skilled in the art. It is therefor the intention that the appended claims be interpreted as broadly as possible in view of the prior art to include all such variations and modifications.

What is claimed is:

1. A method of making a metallic member for use in the fabrication of a plurality of semiconductor devices, comprising the steps of 1. providing a blank of electrically conductive material having a heat sink area extending along the central region of the blank,
   2. operating on said blank to form contact members therein adjacent said heat sink area and coplanar therewith,
   3. folding said blank to provide a substantially right angle between said contact members and said plane, and
   4. folding said blank between said fold of step (3) and said heat sink to provide substantially right angle rotation to said contact members in a direction opposite to the rotation thereof in step (3) to provide the completed member.

2. A method as set forth in claim 1 wherein said blank is substantially rectangular.

3. A method as set forth in claim 1 wherein said heat sink area has greater thickness than the remainder of said blank.

4. A method as set forth in claim 2 wherein said heat sink area has greater thickness than the remainder of said blank.

* * * * *